United States Patent

Bellotto

[11] Patent Number: 5,865,544
[45] Date of Patent: Feb. 2, 1999

[54] DOT-MATRIX PRINT HEAD, IN PARTICULAR FOR MAGNETIC INK PRINTERS

[75] Inventor: Franco Bellotto, Moncalieri, Italy

[73] Assignee: Panini S.p.A., Turin, Italy

[21] Appl. No.: 844,573

[22] Filed: Apr. 18, 1997

[51] Int. Cl.⁶ .................................................. B41J 2/255
[52] U.S. Cl. ................................ 400/124.28; 400/124.01
[58] Field of Search ........................ 400/124.28, 124 TA, 400/124.01

[56] References Cited

U.S. PATENT DOCUMENTS 4,255,062   3/1981   Hendrischk ........................ 400/124.28

FOREIGN PATENT DOCUMENTS 0212361   10/1985   Japan ................................. 400/124.28
0069373   3/1991    Japan ................................. 400/124.28
403159753  7/1991   Japan ................................. 400/124.28

*Primary Examiner*—John Hilten
*Attorney, Agent, or Firm*—Seed and Berry LLP

[57] ABSTRACT

A dot-matrix print head comprising a pin guide body including:

a first array of pin guide holes having respective centers aligned on a first longitudinal straight line and spaced from one another longitudinally by a constant distance equal to one pitch; and a second array of pin guide holes having respective centers aligned on a second longitudinal straight line parallel to the first and spaced from one another along the second longitudinal straight line by a constant distance equal to the said pitch. The center of each of the holes of the second array is disposed on a respective transverse straight line which intersects the first longitudinal straight line at a point equidistant between the centers of two adjacent holes of the first array.

9 Claims, 3 Drawing Sheets

DOT-MATRIX PRINT HEAD, IN PARTICULAR FOR MAGNETIC INK PRINTERS

The present invention relates in general to printers and in particular to printers utilised in banking for printing magnetic characters.

International standard ISO 1004-1977 specifies the shape, dimensions and tolerances for ten numerical characters and four special characters for magnetic ink print utilised for the purpose of characters recognition. The standards describe various types of print defects and the tolerances and variations permitted with respect to the reference characters.

The characters defined in International standard ISO 1004 have been initially developed for use in banking to allow the automatic treatment of data relating to bank documents (typically cheque payments). However, the characters defined in this standard can be utilised in any system for the automatic treatment of data.

Printers utilised to print magnetic characters onto documents which are subsequently processed by automatic treatment systems must be able to print the characters entirely in accordance with the standard because, if not, the data may not be read or may be read in an erroneous manner by the automatic reading systems. Until now, for printing magnetic characters according to the ISO 1004-1977 standard print heads with preformed characters have in almost all cases been utilised. A typical example of this type of printer comprise daisy-wheel printers and printers with a wheel or roller on which the characters are incised in relief. With printers of this type it is relatively easy to print characters with the specified shape, dimensions and tolerances. For this reason all magnetic ink printing machines which work according to the ISO 1004-1977 standard are formed in this way.

The disadvantage of printers with preformed characters is represented by their low working speed.

Printers with dot-matrix print heads would make it possible to obtain significantly higher working speeds but until now have not been utilised in the specific sector of printing characters according to ISO 1004 standards because the existing printers are not able to meet the tolerances imposed by this type of regulation.

The main object of the present invention is to provide a dot-matrix print head which can operate in conformity with the ISO 1004-1977 standard.

According to the present invention, this object is achieved by a dot-matrix print head provided with a pin guide body including a first and a second array of holes for guiding the pins, disposed in such a way that the holes of the first array have respective centres aligned along a first longitudinal straight line and spaced from one another along the said first array by a constant distance equal to one pitch. The holes of the second array have respective centres aligned on a second longitudinal straight line parallel to the first and spaced from one another along the said second straight line by a constant distance equal to the said pitch. The centre of each of the holes of the second array is disposed on a transverse straight line which intersects the first straight line at an intermediate point between the centres of the two adjacent holes of the first array.

Preferably, the second array comprises a number of guide holes less by one than the number of holes of the first array. For example, the first array could have nine holes each of which can receive a pin with a diameter of 0.32 mm whilst the second array will have eight holes.

The reproducibility of characters specified in ISO 1004 standard can be further improved by providing a third array of holes comprising first and second pairs of holes aligned along a third longitudinal straight line, the centre of each hole of the third array being disposed on a third transverse straight line equidistant between a first transverse straight line passing through the centre of one hole of the first array and between a second transverse straight line passing through the centre of a hole of the second array.

The invention will now be described in detail with reference to the attached drawings, given purely by way of non-limitative example, in which.

Figure 1:
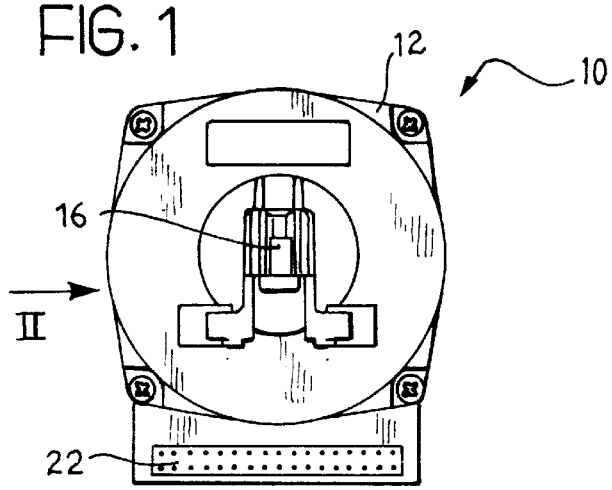
FIG. 1 is a front elevation view of a print head according to the present invention.
Figure 2:
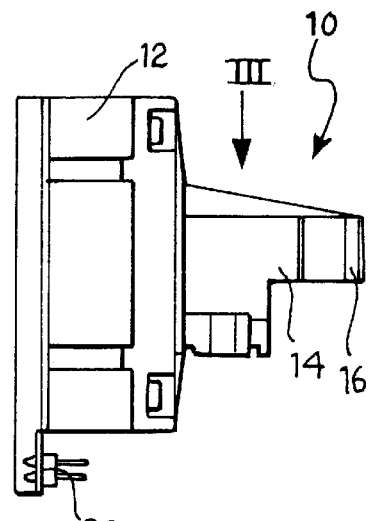
FIG. 2 is a side view in the direction of the arrow II of FIG. 1.
Figure 3:
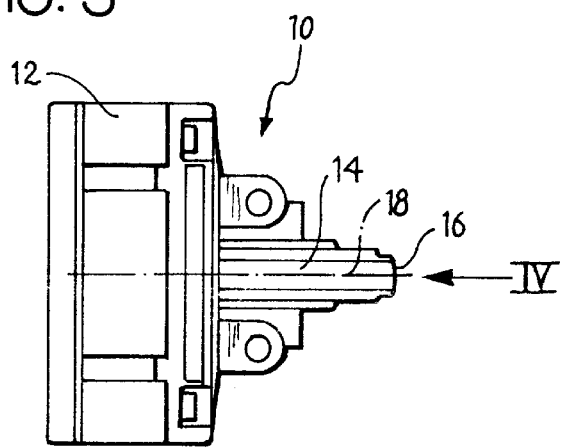
FIG. 3 is a plan view in the direction of the arrow III of FIG. 2.

With reference to FIGS. 1 to 3, the reference numeral 10 indicates a dot-matrix print head having a casing 12 from a front face of which extends a projection 14 carrying at its distal end a body 16 for guiding the pins. The pins are housed within the projection 14 and extend in a direction parallel to the axis indicated 18 in FIG. 3.

Within the casing 12 are housed actuator means, known per se, electromagnetically controlled to cause the movement of respective pins between an extended position and a retracted position. The actuator means are connected to a connector 20 by means of which the print head 10 is connected to a control unit operable to command activation of the actuator means associated with the pins according to a preestablished program.

Figure 5:
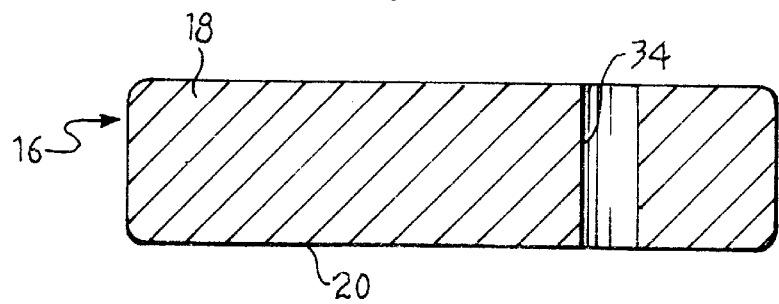
FIG. 5 is a section taken on the line V—V of FIG. 4.
Figure 4:
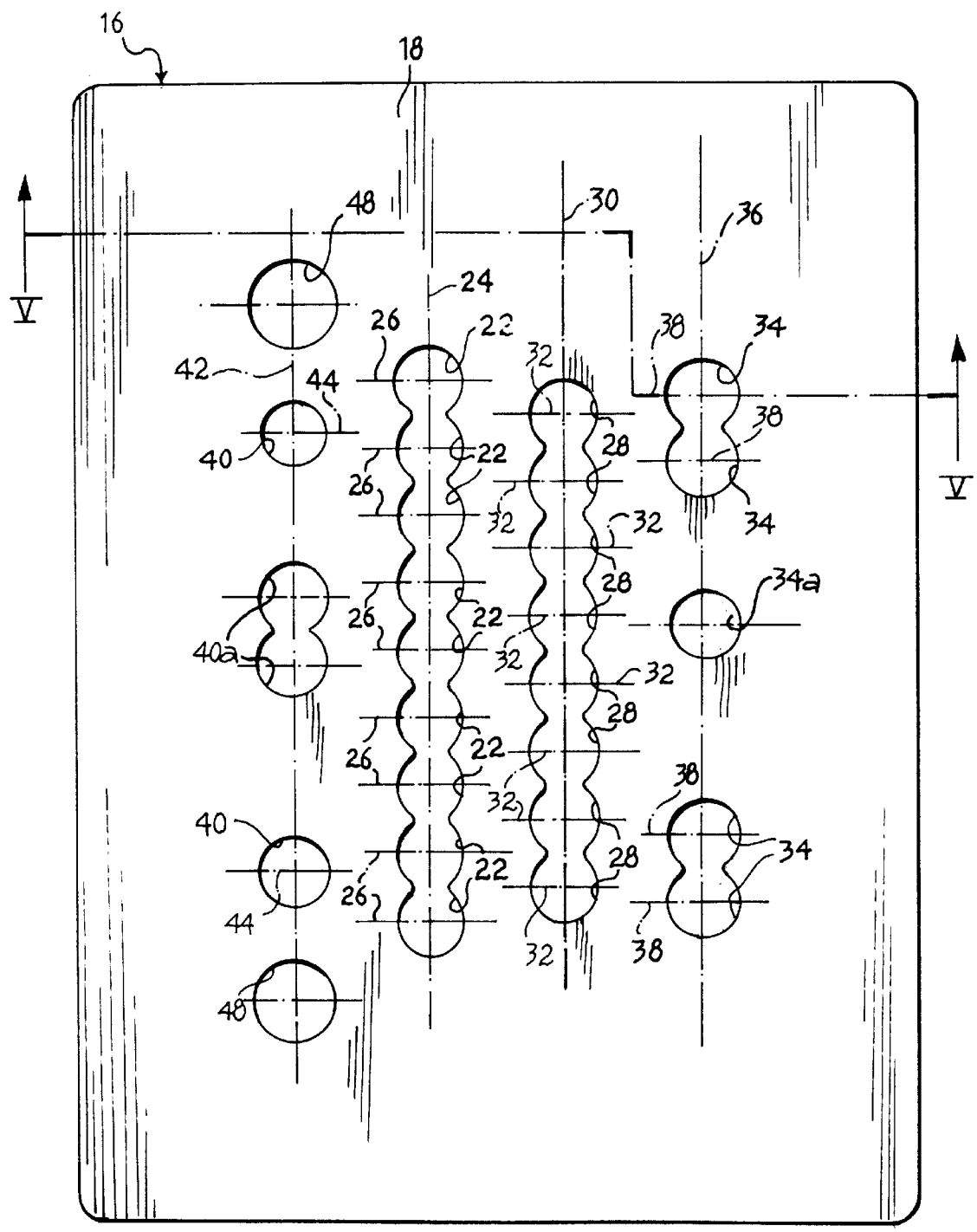
FIG. 4 is a view on an enlarged scale of the part indicated by the arrow IV of FIG. 3.

With reference to FIGS. 4 and 5, the pin guide body 16 has essentially the shape of a parallelepiped with two flat faces 18, 20 in which are formed a plurality of through holes each of which is intended to receive and guide a respective pin.

With particular reference to FIG. 4, the guide body 16 has a first array of holes 22 the centres of which are aligned along a first longitudinal straight line 24. The centres of the holes 22 are positioned on respective first transverse straight lines 26 spaced from one another in a longitudinal direction by a constant quantity called the pitch. The pitch is equal to or slightly less than the diameter of the holes 22. Consequently, the array of holes 22 forms a single through hole formed by a succession of circular arcs separated from one another by narrow passages corresponding to the sections which separate two adjacent holes.

The guide body 16 has a second array formed by a plurality of holes 28 the centres of which are aligned with one another along a second longitudinal straight line 30 parallel to the first straight line 24 and spaced from this latter by a multiple of the pitch, typically equal to twice the pitch. The holes 28 have the same diameter as the holes 22 and are spaced from one another along the straight line 30 by a distance equal to the pitch between the holes 22 of the first array. The centres of the holes 28 lie on respective transverse straight lines 32. Each transverse straight line 32 lies in a position substantially intermediate between two adjacent transverse straight lines 26 and therefore intersects the first longitudinal straight line 24 at a point equidistant between the centres of two adjacent holes 22. In the example illustrated in the drawings, the holes 28 of the second array are fewer in number by one than the number of holes 22 of the first array. In a practical embodiment the first and second arrays are formed respectively with nine and eight holes with a diameter of 0.34 mm±0.01 mm, spaced from one another by a pitch equal to 0.33 mm±0.01 mm. The holes 22, 28 are intended to receive respective pins with a diameter of 0.32±0.01 mm.

The guide body 16 can moreover be provided with a third and, possibly, a fourth array of holes. The third array is preferably formed by two pairs of holes 34 the centres of which are aligned along a third longitudinal straight line 36 parallel to the longitudinal straight line 30 and spaced from this latter by a distance substantially equal to twice the pitch. The pairs of holes 34 are disposed in correspondence with respective ends of the first or the second array. The centres of the holes 34 are disposed on respective transverse straight lines 38 each of which are disposed at an intermediate distance between a first transverse straight line 26 and a second transverse straight line 32 of corresponding holes 22, 28 adjacent the hole 34 in question. The third array can include a further hole 34a interposed between the two pairs of holes 34.

Taking the first array of holes 22 as a reference, the second array of holes 28 is offset with respect to the corresponding holes of the first array by half of one pitch whilst each hole 34 of the third array is offset with respect to a corresponding hole of the firs t array by a quarter of a pitch.

The fourth array comprises two holes 40 aligned along a fourth longitudinal straight line 42 parallel to the first longitudinal straight line 24 and spaced from this latter by a distance substantially equal to twice the pitch. Each hole 40 has its centre situated on a transverse straight line 44 which in a longitudinal direction, is equidistant between the transverse straight lines 38 relating to the corresponding pair of holes 34. In comparison with the holes 22 of the first array, the holes 40 of the fourth array are therefore offset by ¾ of a pitch. A further pair of holes 40a can be interposed between the two holes 40 along the straight line 42.

The guide body 16 is further provided with a pair of reference through holes 48 which serve for mounting the guide body 16 on the head 10.

Figure 6:
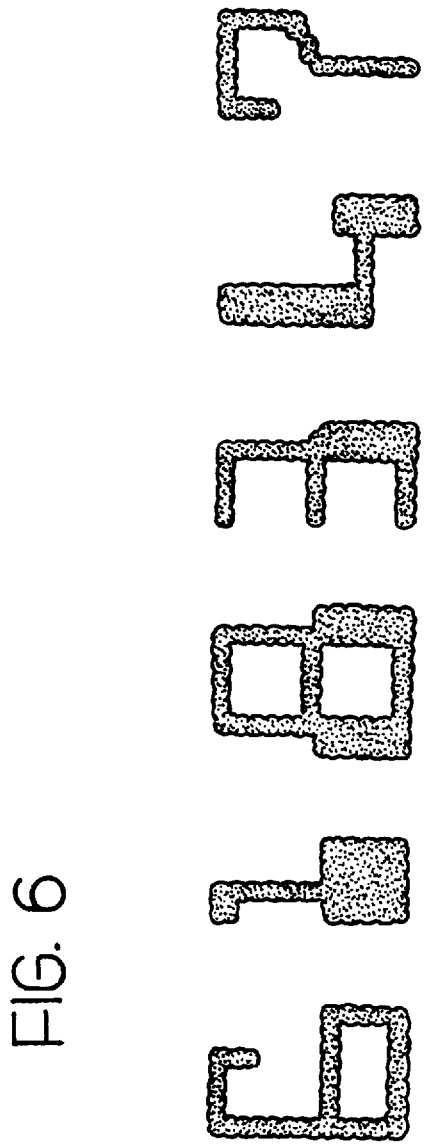
FIG. 6 illustrates, on a very enlarged scale, some of the characters which can be printed with the print head of the invention.

FIG. 6 illustrates, on an enlarged scale, some of the characters corresponding to the ISO 1004 standard printed with the print head according to the invention. Experimental tests performed by the applicant have made it possible to demonstrate that the disposition of the pins described above allows a very high precision of reproduction of the characters defined in the standard in question to be obtained. The rectilinear sections of the characters have an undulation which is characteristic of dot-matrix printers; however, such undulations are well below the limit of tolerance specified in the standard. In comparison with printers with preformed characters (daisy wheel or character wheel printers) the dot-matrix print head according to the present invention allows a significantly higher speed of operation to be obtained. The printer according to the invention easily allows operation at speeds of the order of 100 characters per second whilst printers with preformed characters operate at speeds of the order of 20–50 characters per second.

Moreover, in comparison with printers with preformed characters, the dot-matrix print head of the invention has the advantage of a better dimensional stability of the characters over time. In fact, in printers with preformed characters, wear of the characters causes a progressive enlargement of the dimensions of the printed characters. Consequently, after extended use it is necessary to replace print heads having preformed characters to avoid the risk that the printed characters will no longer lie within the specification set by the standard. On the other hand, in the dot-matrix printer according to the invention, even a high wear of the pins does not modify the shape of the printed character even minimally.

The details of construction and the embodiment illustrated can be varied at will without departing from the scope of the invention defined by the following claims.

What is claimed is:

1. A dot-matrix print head comprising a pin guide body including:

a first array of pin guide holes having respective centres aligned on a first longitudinal straight line and spaced from one another along the said first straight line by a constant distance equal to one pitch;

a second array of pin guide holes having respective centres aligned on a second longitudinal straight line parallel to the first and spaced from one another along the said second straight line by a constant distance equal to the said pitch, in which the centre of each of the holes of the second array is disposed on a respective transverse straight line intersecting the first longitudinal straight line at a point equidistant between the centres of two adjacent holes of the first array; and a third array of holes including at least one first and one second pair of holes aligned along a third longitudinal straight line, in which the centres of each of the holes of the third array are disposed on respective transverse straight lines each of which is equidistant between a first transverse straight line passing through the centre of a hole of the first array and a second transverse straight line passing through the centre of a hole of the second array.

2. A print head according to claim 1, in which the second array comprises a number of holes less by one than the number of holes of the first array.

3. A print head according to claim 2, in which the first and second longitudinal straight lines are spaced from one another in a transverse direction by an amount equal to a multiple of the said pitch.

4. A print head according to claim 1, in which each of the said holes has a diameter equal to or greater than the said pitch.

5. A print head according to claim 1, in which the first and second pair of holes of the third array are disposed in correspondence with respective ends of one of the said first and second array of holes.

6. A print head according to claim 1, including a fourth array of holes having at least two holes the centres of which are aligned along a fourth longitudinal straight line, each of the holes of the fourth array having its centre on a fourth transverse straight line which intersects the said third longitudinal straight line at a point equidistant between the centres of the two adjacent holes of the third array.

7. A print head according to claim 1, including a further hole the centre of which is disposed on the third longitudinal straight line in a position intermediate between the said first and the said second pair of holes of the third array.

8. A print head according to claim 6, including a further pair of holes the centers of which are disposed on the fourth longitudinal straight line in a position intermediate between the centres of the said holes of the fourth array.

9. A print head according to claim 1, in which each pin has a diameter equal to 0.32±0.01 mm.

* * * * *